United States Patent
Iyatani

(10) Patent No.: US 9,061,666 B2
(45) Date of Patent: Jun. 23, 2015

(54) ELECTRONIC CONTROL UNIT ASSEMBLING METHOD, ELECTRONIC CONTROL UNIT AND VEHICLE BRAKE HYDRAULIC PRESSURE CONTROL APPARATUS

(75) Inventor: Masatoshi Iyatani, Nagano (JP)

(73) Assignee: NISSIN KOGYO CO., LTD., Nagano (JP)

( * ) Notice: Subject to any disclaimer, the term of this patent is extended or adjusted under 35 U.S.C. 154(b) by 948 days.

(21) Appl. No.: 12/881,424

(22) Filed: Sep. 14, 2010

(65) Prior Publication Data

US 2011/0062775 A1 Mar. 17, 2011

(30) Foreign Application Priority Data

Sep. 15, 2009 (JP) ................................. 2009-213270
Sep. 15, 2009 (JP) ................................. 2009-213271
Sep. 15, 2009 (JP) ................................. 2009-213272

(51) Int. Cl.
*B60T 15/00* (2006.01)
*B60T 8/36* (2006.01)
(Continued)

(52) U.S. Cl.
CPC ............ *B60T 8/368* (2013.01); *Y10T 29/49002* (2015.01); *G06F 1/16* (2013.01); *B60T 15/00* (2013.01)

(58) Field of Classification Search
CPC ........... B60T 8/17; B60T 8/368; B60T 13/66; B60T 15/00; B60T 17/00; Y10T 29/49002; G06F 1/16
USPC ................. 303/3, 20, 119.2, 119.3, 191, 199, 303/DIG. 9, DIG. 10; 701/70, 78; 361/600, 361/679.02, 730, 752, 807, 810
See application file for complete search history.

(56) References Cited

U.S. PATENT DOCUMENTS 5,288,141 A * 2/1994 Isshiki et al. ................ 303/119.3
5,988,772 A * 11/1999 Hashida ....................... 303/119.3
(Continued)

FOREIGN PATENT DOCUMENTS

JP 6243161 U 3/1987
JP 3100807 A 4/1991
(Continued)

OTHER PUBLICATIONS

English Machine Translation of JP-2009029240.*
(Continued)

*Primary Examiner* — Melody Burch
(74) *Attorney, Agent, or Firm* — Andrew M. Calderon; Roberts Mlotkowski Safran & Cole, P.C.

(57) ABSTRACT

An electronic control unit includes: a sensor board on which a sensor is mounted; a control board configured to control an operation of each electric component, based on a physical quantity detected by the sensor; and a housing configured to accommodate the sensor board and the control board, wherein: in an internal space of the housing, a first accommodation chamber in which the electric component is accommodated, a second accommodation chamber in which the sensor board and the control board are accommodated in a hierarchical state, and a partitioning portion which partitions between the first accommodation chamber and the second accommodation chamber are formed; and the sensor board and the control board are supported by the partitioning portion, and a rib is protrudingly provided on the partitioning portion.

17 Claims, 13 Drawing Sheets

(51) Int. Cl.
*G06G 1/16* (2006.01)
*G06F 1/16* (2006.01)

(56) References Cited

U.S. PATENT DOCUMENTS

| | | | |
|---|---|---|---|
| 6,634,723 B1 * | 10/2003 | Parker et al. | 303/119.3 |
| 7,375,313 B2 * | 5/2008 | Lee et al. | 250/221 |
| 2003/0056871 A1 * | 3/2003 | Nakajima et al. | 156/73.5 |
| 2010/0133896 A1 * | 6/2010 | Iyatani et al. | 303/20 |

FOREIGN PATENT DOCUMENTS

| | | |
|---|---|---|
| JP | 4240800 A | 8/1992 |
| JP | 10322096 A | 12/1998 |
| JP | 2000168528 A | 6/2000 |
| JP | 2004216931 A | 8/2004 |
| JP | 2007237832 A | 9/2007 |
| JP | 2007255524 A | 10/2007 |
| JP | 2008105535 | 5/2008 |
| JP | 2008174218 A | 7/2008 |
| JP | 2009029240 A | 2/2009 |

OTHER PUBLICATIONS

Japanese Office Action for Application No. 2009-213270 dated Jun. 14, 2011.

Japanese Office Action for Application No. 2009-213272 dated Jun. 14, 2011.

* cited by examiner

ELECTRONIC CONTROL UNIT ASSEMBLING METHOD, ELECTRONIC CONTROL UNIT AND VEHICLE BRAKE HYDRAULIC PRESSURE CONTROL APPARATUS

BACKGROUND

1. Field of the Invention

The present invention relates to an electronic control unit assembling method, an electronic control unit, and a vehicle brake hydraulic pressure control apparatus.

2. Description of the Related Art

A vehicle brake hydraulic pressure control apparatus has a base body in which a brake fluid line is formed, a motor for operating a pump which sucks a brake fluid from a reservoir formed in the base body, a sensor for detecting the behavior of a vehicle body, an electromagnetic valve attached to the base body, and an electronic control unit for controlling an operation of the motor.

The electronic control unit of the vehicle brake hydraulic pressure control apparatus has a control board for controlling operations of the electromagnetic valve and the motor based on the behavior of the vehicle body detected by the sensor, and a housing in which the control board is accommodated.

A housing of a conventional electronic control unit is configured such that a first accommodation chamber in which electronic components such as an electromagnetic valve protruded from the base body are accommodated, and a second accommodation chamber in which the control board is accommodated are formed in the internal space of the housing, and that a partitioning portion for partitioning between the first accommodation chamber and the second accommodation chamber is provided in the housing (see, e.g., JP-A-2008-105535).

A conventional electronic control unit is configured such that a sensor board on which a sensor is mounted is accommodated in the second accommodation chamber of the housing, and that the sensor board is supported by the partitioning portion. With this configuration, it is unnecessary to accommodate the sensor and the electronic control unit separately from each other in a vehicle interior.

Further, one of conventional electronic control units is configured such that a sensor board and a control board are accommodated in the second accommodation chamber of the housing in a hierarchical state by putting the sensor board on which the sensor is mounted on a second-accommodation-chamber-side surface of the partitioning portion. With this configuration, it is unnecessary to accommodate the sensor and the electronic control unit in a vehicle interior separately from each other.

In the case of the conventional electronic control unit in which the sensor board is supported by the partitioning portion, as described above, the detection accuracy of the sensor may be degraded when low-frequency vibrations generated at a housing exterior portion and an electric component are transmitted to the sensor via the partitioning portion of the housing.

In the case of vibration-welding a cover to the housing, when vibrations generated at the welding are transmitted to the sensor via the partitioning portion of the housing, the detection accuracy of the sensor may be affected.

Further, in the above conventional electronic control unit, a first connection terminal of the electric component and a second connection terminal provided in the housing are protruded from the second-accommodation-chamber-side surface of the partitioning portion. The first and second connection terminals are electrically connected to each other by being resistance-welded to each other. A plurality of sets of the first and second connection terminals resistance-welded to each other are arranged around the sensor board. Accordingly, in the conventional electronic control unit, a welding space is secured by setting the distance between the sensor board and each connection terminal at a large value such that the resistance-welding can be performed by pinching each connection terminal with the tip end portions of a welding tool. Thus, the conventional electronic control unit has the problem of increasing the size of the housing.

SUMMARY

An object of the invention is to solve the above problems, to provide an electronic control unit which can reduce vibrations transmitted to the sensor accommodated in the housing, can enhance the detection accuracy of the sensor, and can enhance the accuracy of molding the sensor accommodation portion, and to provide a vehicle brake hydraulic pressure control apparatus using the electronic control unit.

Further, another object of the invention is to solve the above problems, and to provide an electronic control unit assembling method, an electronic control unit, and a vehicle brake hydraulic pressure control apparatus, which are enabled to miniaturize a housing.

According to an aspect of the invention, there is provided an electronic control unit including: a sensor board on which a sensor is mounted; a control board configured to control an operation of each electric component, based on a physical quantity detected by the sensor; and a housing configured to accommodate the sensor board and the control board, wherein: a first accommodation chamber in which the electric component is accommodated, a second accommodation chamber in which the sensor board and the control board are accommodated in a hierarchical state, and a partitioning portion which partitions between the first accommodation chamber and the second accommodation chamber are formed in an internal space of the housing; and the sensor board and the control board are supported by the partitioning portion, and a rib is protrudingly provided on the partitioning portion.

With this configuration, the stiffness of the partitioning portion is increased by providing the rib on the partitioning portion. Thus, the natural frequency of the partitioning portion is increased. Consequently, low-frequency vibrations become difficult to be transmitted to the sensor supported by the partitioning portion. Accordingly, the detection accuracy of the sensor can be enhanced.

According to the above aspect, a surface of the partitioning portion, which is provided at a side of the first accommodation chamber, may be partitioned into a plurality of regions by the rib, and a plurality of the electric components may be supported by the partitioning portion in the plurality of regions, respectively.

With this configuration, occurrence of interference between each electric component accommodated in the first accommodation chamber and the rib protrudingly provided on the partitioning portion can be prevented.

According to the above aspect, a concave portion opened in the second accommodation chamber may be formed in the partitioning portion, and a sensor accommodation portion serving as a space accommodating the sensor may be formed utilizing the concave portion.

With this configuration, the sensor accommodation portion is provided by effectively utilizing the space of the first accommodation chamber. Consequently, the housing can be miniaturized.

Heat generated from the electric component is shielded by the concave portion. Consequently, heat can be prevented from affecting the sensor. Accordingly, the detection accuracy of the sensor can be enhanced.

With the configuration in which a rib is protrudingly provided on at least one of the inner surface and the outer surface of the concave portion in the electronic control unit, the thickness of the concave portion is increased. When the ejection-molding of the partitioning portion is performed, the run of molten metal into the concave portion is enhanced in the cavity of the mold. The accuracy of molding the sensor accommodation portion can be enhanced.

With the configuration in which each of an angular velocity sensor and an acceleration sensor is used as the sensor in the above electronic control unit, the detection accuracy of each of the angular velocity sensor and the acceleration sensor used in the case of detecting the behavior of a vehicle body can be enhanced.

According to the above aspect, a cover airtightly sealing an opening portion of the housing may be vibration-welded to the opening portion of the housing.

According to the invention, the rib is provided on the partitioning portion. Thus, the stiffness of the partitioning portion is increased. In addition, the natural frequency of the partitioning portion is increased. Accordingly, vibrations generated at vibration-welding are difficult to be transmitted to the sensor accommodated in the sensor accommodation portion. Thus, even when the cover is vibration-welded to the housing in a state in which the sensor is accommodated in the sensor accommodation portion, the detection accuracy of the sensor can be enhanced.

According to another aspect of the invention, there is provided a vehicle brake hydraulic pressure control apparatus including: a base body in which a brake fluid line is formed; and the electronic control unit, wherein the control board varies a brake fluid pressure in the brake fluid line by controlling an operation of the electric component based on behavior of a vehicle body, which is detected by the sensor.

With this configuration, the detection accuracy of each of the angular velocity sensor and the acceleration sensor for detecting the behavior of the vehicle body can be enhanced. The accuracy of brake control can be improved.

According to another aspect of the invention, there is provided an electronic control unit including: a sensor board on which a sensor is mounted; a control board configured to control an operation of an electric component, based an a physical quantity detected by each of the sensor; and a housing configured to accommodate the sensor board and the control board, wherein: a first accommodation chamber in which the electric component is accommodated, a second accommodation chamber in which the sensor board and the control board are accommodated in a hierarchical state, and a partitioning portion which partitions between the first accommodation chamber and the second accommodation chamber are formed in an internal space of the housing; the sensor board and the control board are supported by the partitioning portion; a concave portion opened in the second accommodation chamber is formed in the partitioning portion; a sensor accommodation portion serving as a space accommodating the sensor is formed utilizing the concave portion; and a plurality of ribs are protrudingly provided on at least one of an inner surface and an outer surface of the concave portion.

The ribs may be linearly provided in parallel with one another in the concave portion With this configuration, the stiffness of the concave portion is increased by providing the rib on the concave portion. Thus, the natural frequency of the concave portion is increased. Consequently, low-frequency vibrations become difficult to be transmitted to the sensor accommodated in the sensor accommodation portion. Accordingly, the detection accuracy of the sensor can be enhanced.

In addition, the thickness of the concave portion is increased due to the rib. When the ejection-molding of the partitioning portion is performed, the run of molten metal into the concave portion in the cavity of the mold is enhanced. The accuracy of molding the sensor accommodation portion can be enhanced.

In addition, the sensor accommodation portion is provided by effectively utilizing the space of the first accommodation chamber. Consequently, the housing can be miniaturized.

In addition, heat generated from the electric component is shielded by the concave portion. Consequently, heat can be prevented from affecting the sensor. Accordingly, the detection accuracy of the sensor can be enhanced.

According to the above aspect, terminal-integrated portions to be electrically connected to the ribs may be arranged at positions facing each other across the concave portion in the concave portion, and the ribs may be extended in a direction passing through between one of the terminal-integrated portion and the other terminal-integrated portion.

In addition, the thickness of the concave portion is increased due to the rib. Thus, when the partitioning portion is casted, the run of molten metal into the concave portion in the cavity of the mold can be enhanced. The accuracy of molding the sensor accommodation portion can be enhanced.

According to the above aspect, terminal-integrated portions to be electrically connected to the ribs may be arranged at positions facing each other across the concave portion, and the ribs may be extended in a direction directed from one of the terminal-integrated portion to the other terminal-integrated portion.

With this configuration, the thickness of the concave portion is increased due to the ribs. Thus, when the ejection-molding of the partitioning portion is performed, the run of molten metal into the concave portion can be enhanced. In addition, when the ejection-molding of the partitioning portion is performed, a sprue is provided in an edge portion on which no terminal-integrated portion exists. Thus, the cavity of the rib is arranged to extend like a straight-line from the sprue. Consequently, the run of molten metal into the rib can be enhanced. The accuracy of molding the sensor accommodation portion can be enhanced, when the ejection-molding of the partitioning portion is performed.

According to the above aspect, the sensor may include an angular velocity sensor and an acceleration sensor.

With this configuration, the detection accuracy of each of the angular velocity sensor and the acceleration sensor for detecting the behavior of the vehicle body can be enhanced.

According to the above aspect, a cover airtightly sealing an opening portion of the housing may be vibration-welded to the opening portion.

According to the invention, the rib is provided on the concave portion. Thus, the stiffness of the concave portion is increased. In addition, the natural frequency of the concave portion is increased. Accordingly, vibrations generated at vibration-welding are difficult to be transmitted to the sensor accommodated in the sensor accommodation portion. Thus, even when the cover is vibration-welded to the housing in a state in which the sensor is accommodated in the sensor accommodation portion, the detection accuracy of the sensor can be enhanced.

According to another aspect of the invention, there is provided a vehicle brake hydraulic pressure control apparatus including: a base body in which a brake fluid line is formed;

and the electronic control unit, wherein the control board varies a brake hydraulic pressure in the brake fluid line by controlling an operation of the electric component based on behavior of a vehicle body, which is detected by the sensor.

With this configuration, the detection accuracy of each of the angular velocity sensor and the acceleration sensor for detecting the behavior of the vehicle body can be enhanced. Consequently, the accuracy of brake control can be improved.

According to another aspect of the invention, there is provided an assembling method for an electronic control unit having: a board on which an electric component used for brake control is put; and a housing in which the board is accommodated, wherein a first accommodation chamber in which the electric component is accommodated, a second accommodation chamber in which the board is accommodated, and a partitioning portion which partitions between the first accommodation chamber and the second accommodation chamber are formed in an internal space of the housing, and wherein the board is put on a surface of the partitioning portion, which is provided at a side of the second accommodation chamber, the assembling method including: resistance-welding a first connection terminal of the electric component and a second connection terminal provided on the housing at the side of the second accommodation chamber, and mounting the board on the surface of the partitioning portion, which is provided at the side of the second accommodation chamber.

According to this method, the first connection terminal and the second connection terminal are resistance-welded to each other before the board is attached to the partition portion. Thus, it is unnecessary to place the tip end of the welding tool into between each connection terminal and the board attached to the partitioning portion. Accordingly, the distance between the board and each connection terminal arranged around the board can be reduced. Consequently, the housing can be miniaturized.

According to another aspect of the invention, there is provided an electronic control unit including: a board on which an electric component used for brake control is put; and a housing in which the board is accommodated, wherein: a first accommodation chamber in which the electric component is accommodated, a second accommodation chamber in which the board is accommodated, and a partitioning portion which partitions between the first accommodation chamber and the second accommodation chamber are formed in an internal space of the housing; the board is put and a welded part at which a first connection terminal of the electric component and a second connection terminal provided on the housing are resistance-welded to each other is arranged, on a surface of the partitioning portion which is provided at a side of the second accommodation chamber; and a distance between an outer circumferential edge portion of the board and the welded part between the connection terminals is smaller than a width of a tip end portion of a welding tool for resistance-welding the connection terminals.

With this configuration, the distance between the board and each connection terminal arranged around the board can be reduced. Consequently, the housing can be miniaturized.

When the above electronic control unit is assembled, it is advisable to attach the board to the partitioning portion after the connection terminals are resistance-welded to one another.

A space in the housing can effectively be utilized by placing a part of the board attached to the partitioning portion within a movable region of the welding tool in the above electronic control unit.

According to the above aspect, a sensor serving as the electric component may be put on the board; an electrically conductive member connected to the second connection terminal may be embedded, and a sensor accommodation portion serving as a space accommodating the sensor may be formed in the partitioning portion; and the electrically conductive member may be arranged at a side closer to an edge portion of the partitioning portion than the sensor accommodation portion.

Thus, the electrically conductive member is disposed not to stride across the sensor accommodation portion. Thus, the sensor accommodation portion can be provided in the vicinity of a central part of the partitioning portion.

The sensor accommodation portion can be formed utilizing the concave portion and the opening portion in the partitioning portion.

When the sensor accommodation portion is provided utilizing the concave portion and the opening portion formed in the partitioning portion, the sensor accommodation portion is provided by effectively utilizing a space in the first accommodation chamber. Accordingly, the housing can be miniaturized.

When the sensor accommodation portion is provided utilizing the concave portion formed in the partitioning portion, heat generated from the electric component is shielded by the concave portion. Consequently, heat can be prevented from affecting the sensor. Accordingly, the detection accuracy of the sensor can be enhanced.

According to another aspect of the invention, there is provided a vehicle brake hydraulic pressure control apparatus including: a base body in which a brake fluid line is formed; and the electronic control unit, wherein: the sensor includes an angular velocity sensor and an acceleration sensor; and a brake fluid pressure in the brake fluid line is varied by a control board controlling an operation of the electric component based on behavior of a vehicle body, which is detected by the sensor.

With this configuration, the entire apparatus can be miniaturized using the above electronic control unit. In addition, the detection accuracy of the angular velocity sensor and the acceleration sensor for detecting the behavior of the vehicle body can be enhanced. The accuracy of brake control can be improved.

In the electronic control unit according to the invention, the stiffness of the partitioning portion is large. The natural frequency of the partitioning portion is high. Thus, low-frequency vibrations are difficult to be transmitted to the sensor supported by the partitioning portion. Consequently, the detection accuracy of the sensor can be enhanced.

In the vehicle brake hydraulic pressure control apparatus using the above electronic control unit, the detection accuracy of each of the angular velocity sensor and the acceleration sensor for detecting the behavior of the vehicle body can be enhanced. Consequently, the accuracy of brake control can be enhanced.

In the electronic control unit according to the invention, the stiffness of the concave portion is large. The natural frequency of the concave portion is high. Thus, low-frequency vibrations are difficult to be transmitted to the sensor accommodated in the sensor accommodation portion. Consequently, the detection accuracy of the sensor can be enhanced.

In addition, when the ejection-molding of the partitioning portion is performed, the run of molten metal into the concave portion in the cavity of the mold is enhanced. Consequently, the accuracy of molding the sensor accommodation portion can be enhanced.

In addition, the sensor accommodation portion is provided by effectively utilizing the space in the first accommodation chamber. Consequently, the housing can be miniaturized.

In addition, heat generated from the electric component is shielded by the concave portion. Accordingly, the detection accuracy of the sensor can be enhanced.

In the vehicle brake hydraulic pressure control apparatus using the above electronic control unit, the detection accuracy of each of the angular velocity sensor and the acceleration sensor for detecting the behavior of the vehicle body can be enhanced. Consequently, the accuracy of brake control can be enhanced.

In accordance with the electronic control unit assembling method and the electronic control unit according to the invention, the distance between the board and each connection terminal arranged around the board can be reduced. Consequently, the housing can be miniaturized.

In accordance with the vehicle brake hydraulic pressure control apparatus according to the invention, the entire apparatus can be miniaturized. In addition, the accuracy of brake control can be improved.

BRIEF DESCRIPTION OF THE DRAWINGS

The present invention will become more fully understood from the detailed description given hereinbelow and the accompanying drawing which is given by way of illustration only, and thus is not limitative of the present invention and wherein:

FIG. 10A is a side cross-sectional view illustrating a manner in which connection terminals are resistance-welded to each other. FIG. 10B is a side cross-sectional view illustrating a mode in which the sensor board is mounted on the partitioning portion;

DETAILED DESCRIPTION OF THE INVENTION

Figure 1:
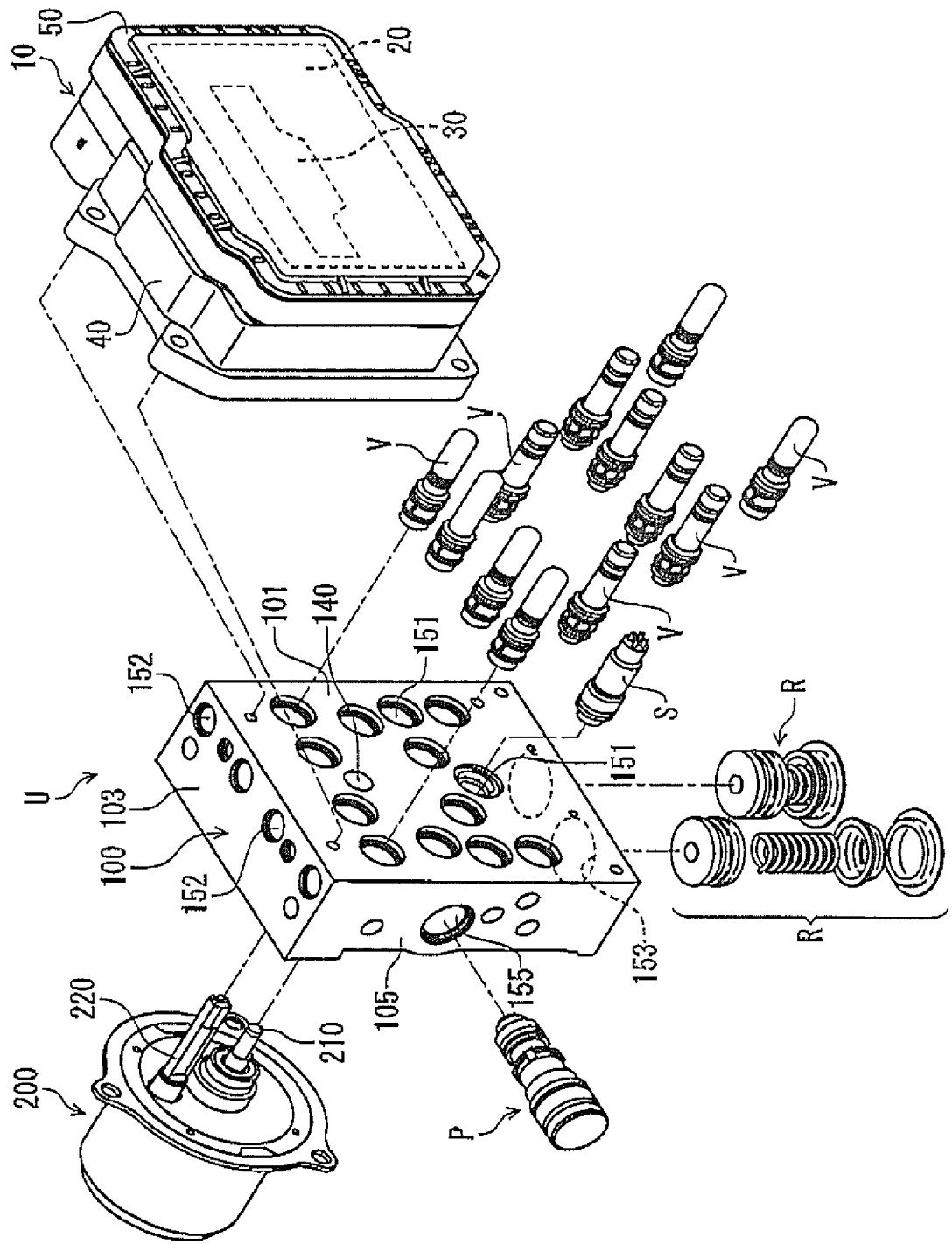
FIG. 1 is an exploded perspective view illustrating a vehicle brake hydraulic pressure control apparatus having an electronic control unit according to an embodiment of the invention.

Next, an embodiment of the invention is described in detail hereinafter by appropriately referring to the drawings.

In the following description of the present embodiment, an electronic control unit applied to a vehicle brake hydraulic pressure control apparatus is described.

As illustrated in FIG. 1, a vehicle brake hydraulic pressure control apparatus U includes mainly electric components such as electromagnetic valves V and a pressure sensor S, electrically powered components such as a motor 200, a base body 100 to which a reciprocating pump P is assembled, and an electronic control unit 10 for detecting the behavior of a vehicle body, and controlling the opening/closing of each electromagnetic valve V and the behavior of the motor 200.

Brake fluid lines are formed in the base body 100. The unit U is configured such that the electronic control unit 10 actuates the electromagnetic valves V and the motor 200 based on the behavior of the vehicle body to thereby change a brake fluid pressure in each brake fluid line.

As illustrated in FIG. 1, the base body 100 is a metallic component formed into a substantially rectangular parallelepiped shape so that the brake fluid lines are formed therein.

A plurality of bottomed mounting holes 151 in which the electromagnetic valves V and the pressure sensor S are mounted, respectively, are formed in the front-side surface 101 of the base body 100 among the surfaces thereof.

A plurality of outlet ports 152 to which pipes led to wheel brakes (not shown) are connected, respectively, are formed in the top surface 103 of the base body 100.

Reservoir holes 153 into which reservoir components R configuring a reservoir are assembled are formed in the bottom surface of the base body 100.

A pump hole 155 in which the reciprocating pump P is mounted is formed in a side surface 105 of the base body 100.

The holes provided in the base body 100 communicate with one another directly or via the brake fluid lines (not shown) formed in an interior of the base body 100.

Figure 2:
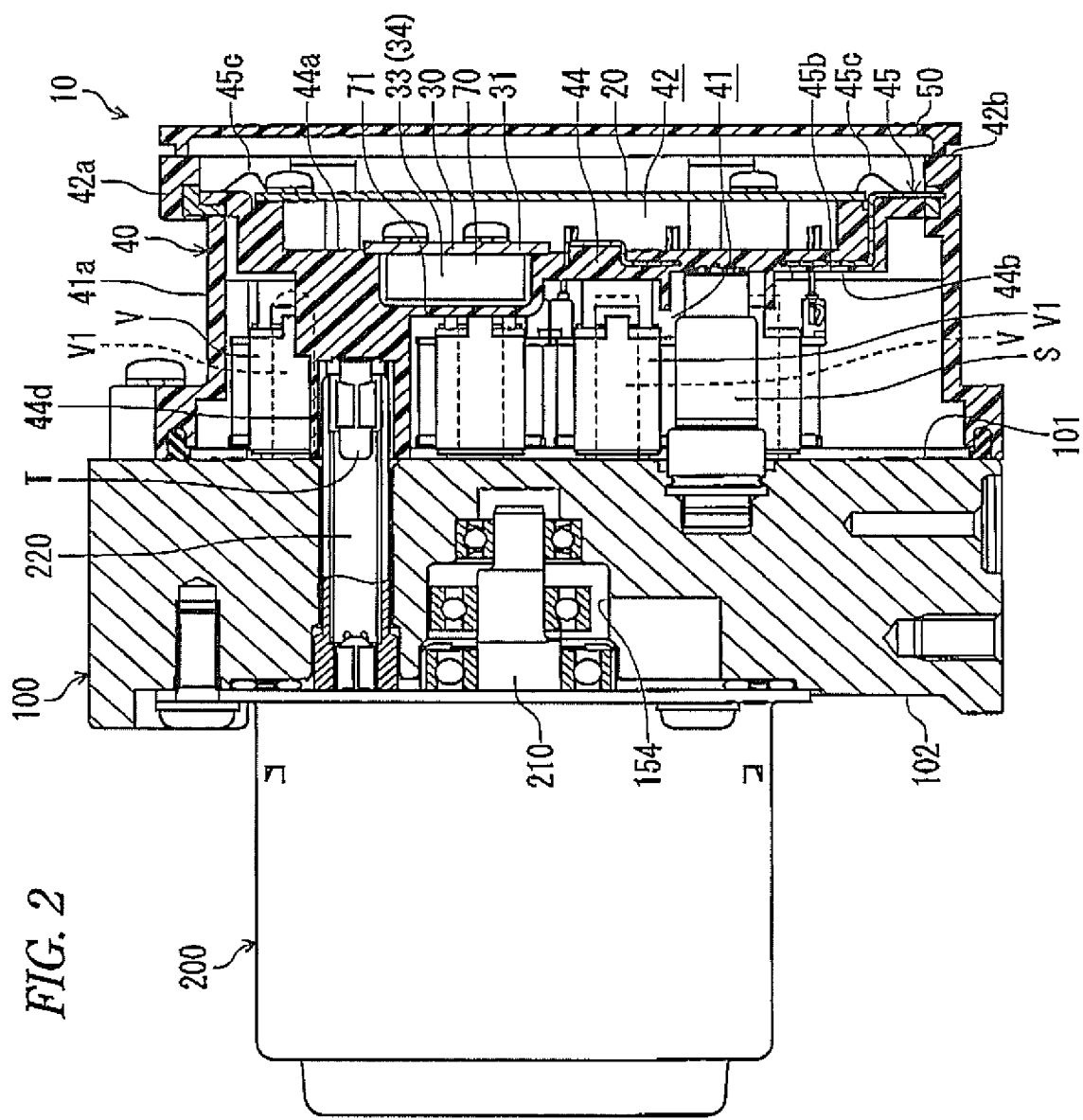
FIG. 2 is a side cross-sectional view illustrating the vehicle brake hydraulic pressure control apparatus having the electronic control unit according to the embodiment of the invention.

The motor 200 is an electrically powered component configuring a power source for the reciprocating pump P and is integrally secured to a rear surface 102 of the base body 100, as illustrated in FIG. 2.

An output shaft 210 of the motor 200 is inserted into a motor mounting hole 154 formed in the rear surface 102 of the base body 100. A motor bus bar 220 for supplying electric power to a rotor (not shown) is connected above the output shaft 210.

The electronic control unit 10 illustrated in FIG. 1 includes a housing 40 which accommodates the electronic components protruding from the front-side surface 101 of the base body 100, a sensor board 30 and a control board 20, and a cover 50 closing an opening portion of the housing 40.

As illustrated in FIG. 2, the housing 40 is a synthetic resin casing integrally secured to the front-side surface 101 of the base body 100 so as to cover the electric components such as the electromagnetic valves V and the pressure sensor S protruding from the front-side surface 101 of the base body 100.

The housing 40 is opened in a front-side surface facing the base body 100 (i.e., the right-hand side in FIG. 2) and a rear-side surface opposite to the side facing the base body 100 (i.e., the left-hand side in FIG. 2). A first accommodation chamber 41 for accommodating the electric components such as the magnetic valves V, magnetic coils V1 and the pressure sensor S is formed in the rear side of the internal space of the housing 40. A second accommodation chamber 42 is formed in the front side of the internal space for accommodating a sensor board 30 and the control board 20.

The housing 40 includes a first circumferential wall portion 41a configuring the first accommodation chamber 41, a connector connection portion 43 (see FIG. 3) disposed on a side of the first circumferential wall portion 41a, a second circumferential wall portion 42a configuring the second accommodation chamber 42, and a partitioning portion 44 for partitioning between the first accommodation chamber 41 and the second accommodation chamber 42.

The first circumferential wall portion 41a is a part surrounding the electric component and includes a flange 41b abutting on an outer circumferential edge of the front-side surface 101 of the base body 100. Mounting holes 41c are formed at proper places of the flange 41b (see FIG. 4).

Figure 3:
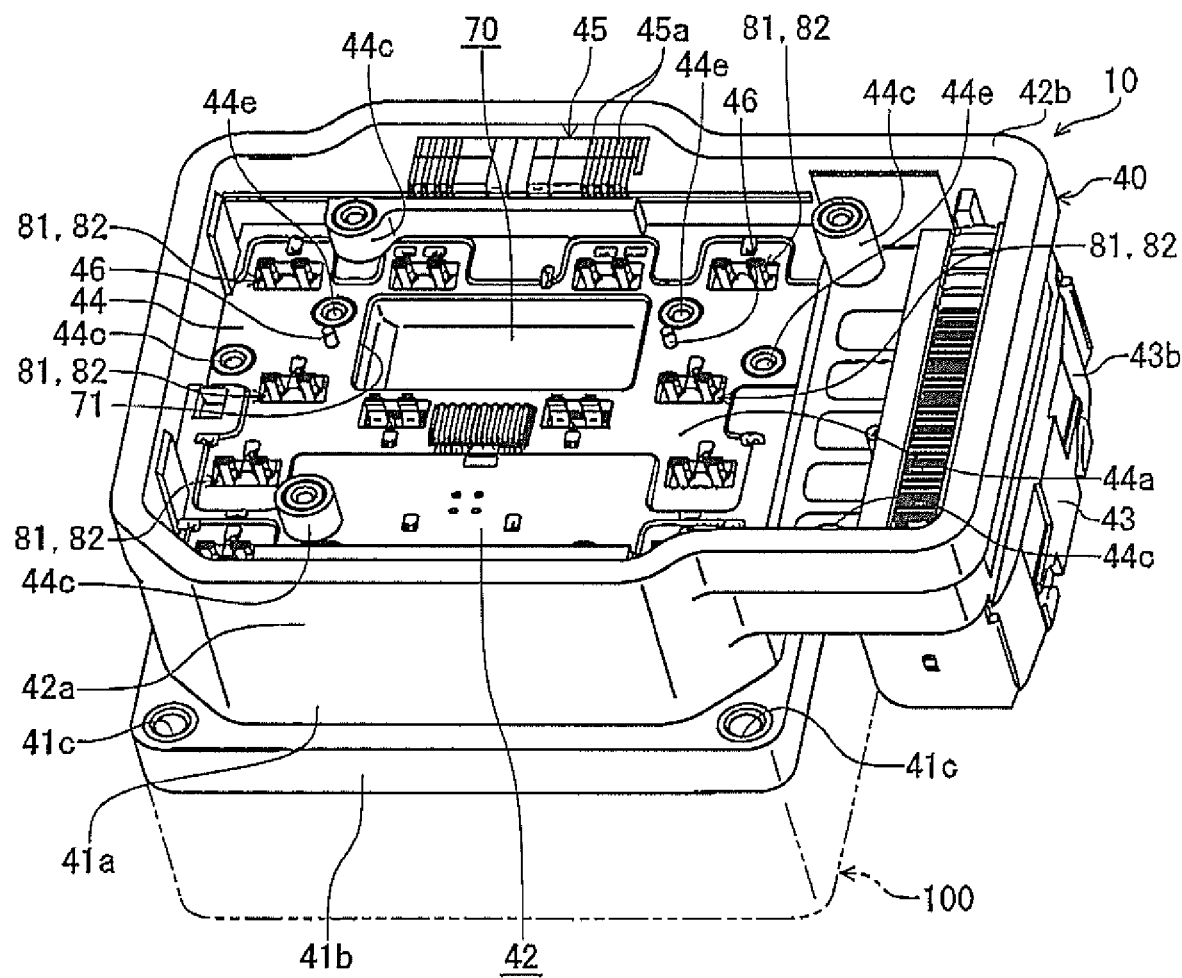
FIG. 3 is a front perspective view illustrating a housing according to the embodiment of the invention, which is in a state before a sensor board and a control board are mounted therein.

The second circumferential wall portion 42a is a part surrounding the sensor board 30 and the control board 20 and disposed on the front side of each of the first circumferential wall portion 41a and the connector connection portion 43 (see FIG. 3).

As illustrated in FIG. 3, the outer circumferential shape of the second circumferential wall portion 42a is a substantially rectangular parallelepiped. An outwardly bulged part is formed on each of two sides in the longitudinal direction (i.e., upper and lower two sides, as viewed in FIG. 3) of the second circumferential wall portion 42a. Terminal-integrated portions 45, 45 are formed on the inner sides of the outwardly bulged parts of the second circumferential wall portion 42a, respectively (see FIG. 7).

A plurality of terminals 45a serving as metallic components are exposed from each of the terminal-integrated portions 45 to a surface at the side of the second accommodation chamber 42. As illustrated in FIG. 2, an electrically conductive member 45b extending from each terminal 45a is embedded in the partitioning portion 44 and electrically connected to a terminal of the electromagnetic coil V1 at the front side (i.e., at the side of the second accommodation chamber 42) of the partitioning portion 44. In addition, the electrically conductive members 45b are electrically connected to a terminal of the pressure sensor S and the motor bus bar 220 of the motor 200 at the rear side (i.e., the side of the first accommodation chamber 41) of the partitioning portion 44.

The connector connection portion 43 illustrated in FIG. 3 is a part to which a connector provided at an end portion of an external wiring cable (not shown). The connector connection portion 43 includes a plurality of connection terminals 43a (see FIG. 4) led out of the second accommodation chamber 42 to the outer surface (surface exposed to the outside) through the bottom wall of the connector connection portion 43 (see FIG. 4) and a side wall 43b surrounding the connection terminals 43a.

As illustrated in FIG. 2, the partitioning portion 44 is a plate-like part facing the front-side surface 101 of the base body 100 by being spaced apart therefrom. As illustrated in FIG. 3, the partitioning portion 44 is formed into a substantially rectangular parallelepiped shape. Board holding portions 44c are protrudingly provided at four corners of a front-side surface 44a (i.e., a surface at the side of the second accommodation chamber 42), respectively.

The board holding portions 44c are parts for holding the control board 20 (see FIG. 12), which will be described below. A protruding end surface of each board holding portion 44c abuts against the rear surface of the control board 20. A female screw hole is formed in the protruding end surface of each board holding portion 44c.

As illustrated in FIG. 2, a terminal mounting portion 44d through which a terminal T to be connected to the motor bus bar 220 penetrates is formed in the rear surface 44b (i.e., the surface at the side of the first accommodation chamber 41) of the partitioning portion 44.

A concave portion 71 opened in the second accommodation chamber 42 to have a rectangular shape in plan view is formed at a position adjacent to the terminal mounting portion 44d in the vicinity of the center of the front-side surface 44a of the partitioning portion 44.

The concave portion 71 protrudes into the first accommodation chamber 41. The internal space of the concave portion 71 serves as a sensor accommodation portion 70 accommodating an angular speed sensor 33 and an acceleration sensor 34 attached to the sensor board 30, which will be described below. That is, the sensor accommodation portion 70 is formed utilizing the concave portion 71 provided on the partitioning portion 44 for partitioning between the first accommodation chamber 41 and the second accommodation chamber 42.

As illustrated in FIG. 3, two reference pins 46, 46 are protrudingly provided on the front-side surface 44a of the partitioning portion 44 across the concave portion 71 lengthwise. In addition, mounting screw holes 44e of each pair are formed across the concave portion 71 lengthwise.

Figure 4:
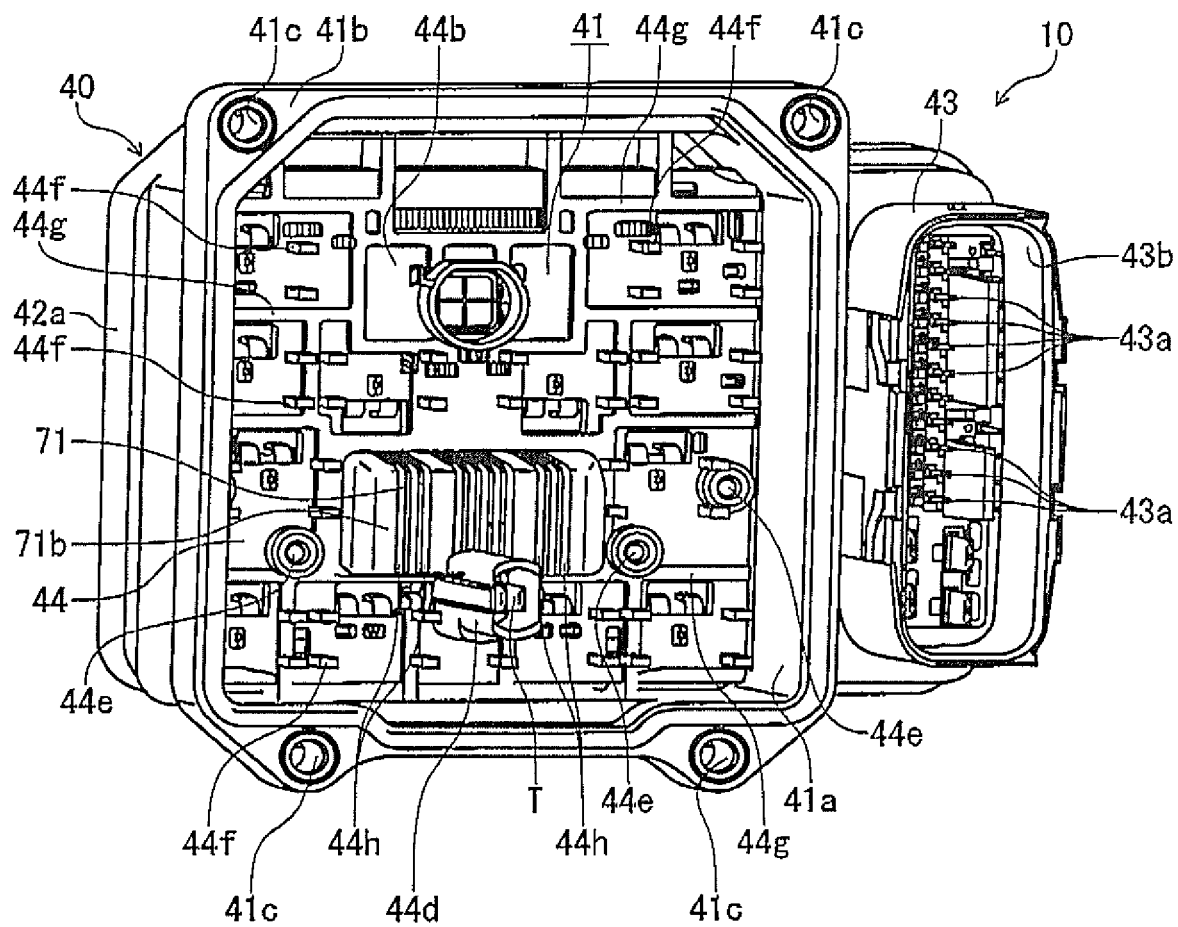
FIG. 4 is a rear perspective view illustrating the housing according to the embodiment of the invention, which is inverted in an up-down direction.

As illustrated in FIG. 4, a plurality of support pieces 44f configuring a device for preventing the electric components such as the electromagnetic coils V1 and the pressure sensor S (see FIG. 2) from vibrating are protrudingly provided on the rear surface 44b of the partitioning portion 44. A set of two or four support pieces 44f corresponds to one electric component.

Figure 5:
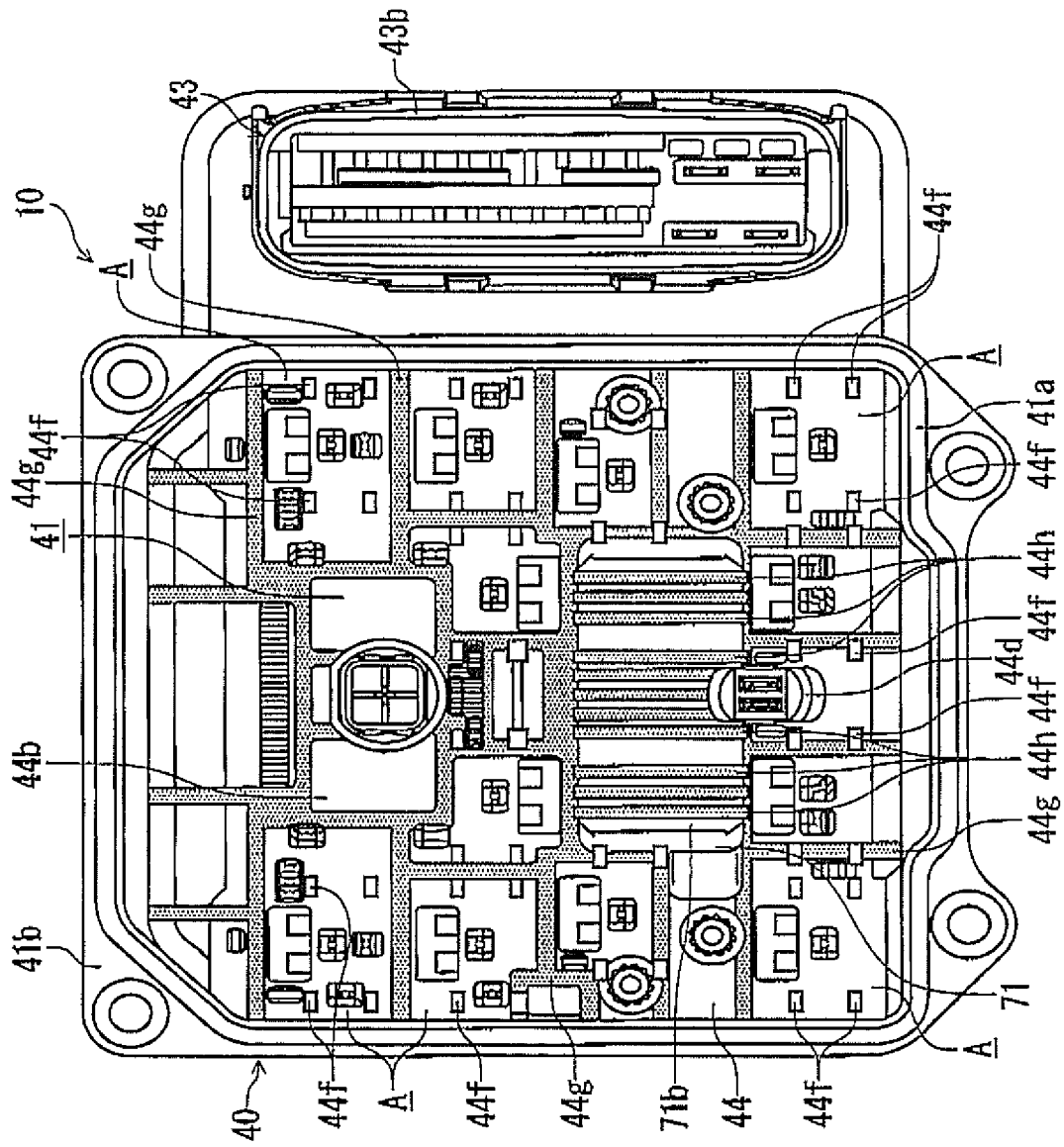
FIG. 5 is a rear view illustrating the housing according to the embodiment of the invention, which is inverted in an up-down direction.

A cross-sectionally rectangular first rib 44g is protrudingly provided on the rear surface 44b of the partitioning portion 44. The first rib 44g is extended over the entire rear surface 44b of the partitioning portion 44. As illustrated in FIG. 5, the rear surface 44b of the partitioning portion 44 is partitioned into a plurality of regions A by the first rib 44g. For simply seeing the arrangement of the first rib 44g, in FIG. 5, the first rib 44g is hatched.

According to the present embodiment, each of the electromagnetic coils V1 arranged on the rear surface 44b of the partitioning portion 44 is supported by the support pieces 44f in an associated one of the regions A into which the rear surface 44b is partitioned by the first rib 44g. That is, the first rib 44g partitions the rear surface 44b of the partitioning portion 44 into a plurality of regions A so that each region A surrounds the mounting location of an associated one of the electric components such as the electromagnetic coils V1. The arrangement and the height of the first rib 44g are set to prevent the first rib 44g from interfering with the electric component.

Cross-sectionally rectangular second ribs 44h are protrudingly provided on the outer surface 71b (i.e., the surface at the side of the first accommodation chamber 41) of the concave portion 71 formed on the partitioning portion 44. In FIG. 5, the second rib 44h is hatched, similarly to the first rib 44g.

The terminal-integrated portions 45, 45 are arranged on the partitioning portion 44 to face each other across the concave portion 71. The second ribs 44h are extended linearly along a direction from one of the terminal-integrated portion 45 (see FIG. 2) to the other terminal-integrated portion 45 (see FIG. 2). According to the present embodiment, a plurality of second ribs 44h are arranged in parallel with one another.

Thus, each second rib 44h is extended in an up-down direction, as viewed in FIG. 5. The terminal-integrated portions 45, 45 (see FIG. 2) are arranged at both ends in the direction of an extension of each second rib 44h. That is, each second rib 44h is arranged in parallel with one side (i.e., one side at the left-hand side of FIG. 5) on which the terminal-integrated portion 45 and the connector connection portion 43 are not arranged.

Figure 6:
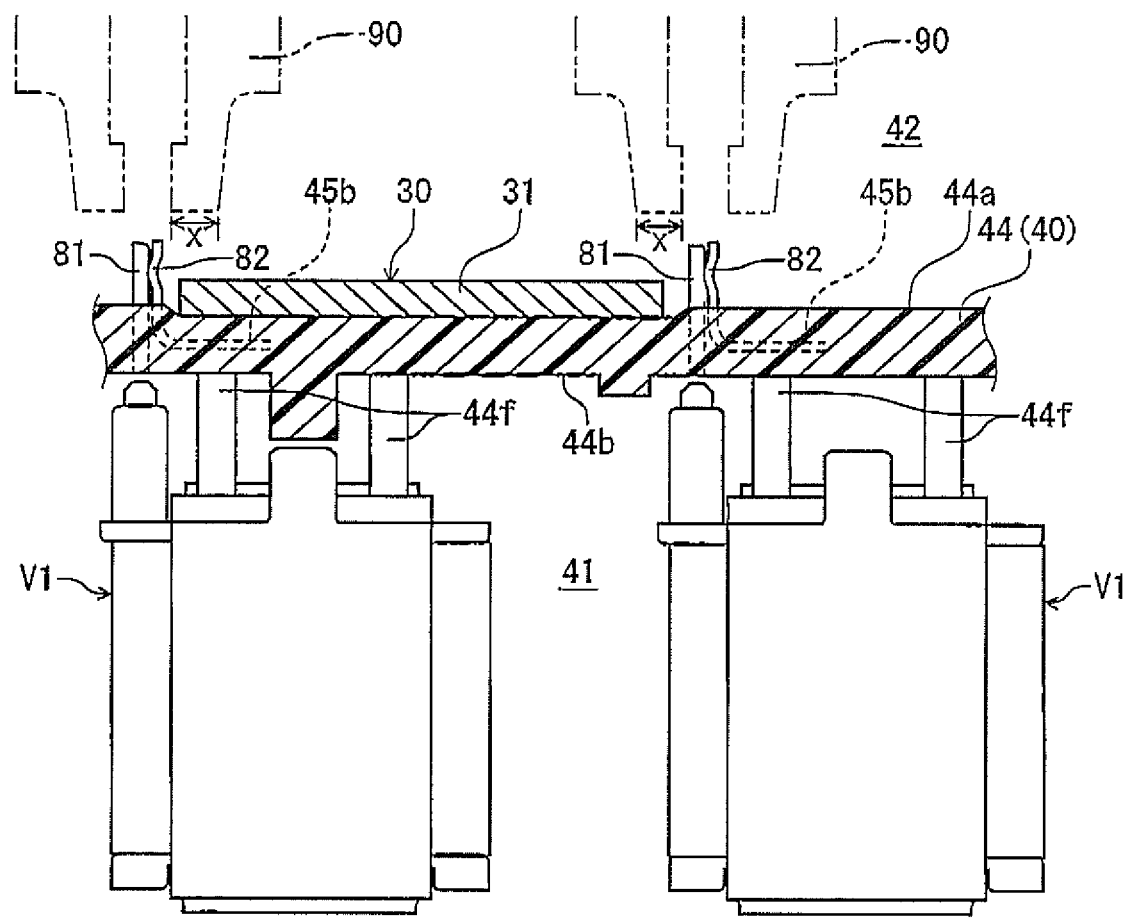
FIG. 6 is a side cross-sectional view illustrating a mounting part on which each of a partitioning portion and a sensor board according to the embodiment of the invention is mounted.

As illustrated in FIG. 6, a plurality of second connection terminals 82 provided at an end portion of each electrically conductive member 45b embedded in the partitioning portion 44 protrude to the side of the second accommodation chamber 42 (see FIG. 3). First connection terminals 81 extended from the electric components such as the electromagnetic coils V1 mounted on the rear surface 44b of the partitioning portion 44 overlap with the second connection terminals 82 on the front-side surface 44a of the partitioning portion 44, respectively, through an opening portion formed in the partitioning portion 44. The first connection terminals 81 are electrically connected to the second connection terminals 82 by being resistance-welded thereto, respectively.

Figure 7:
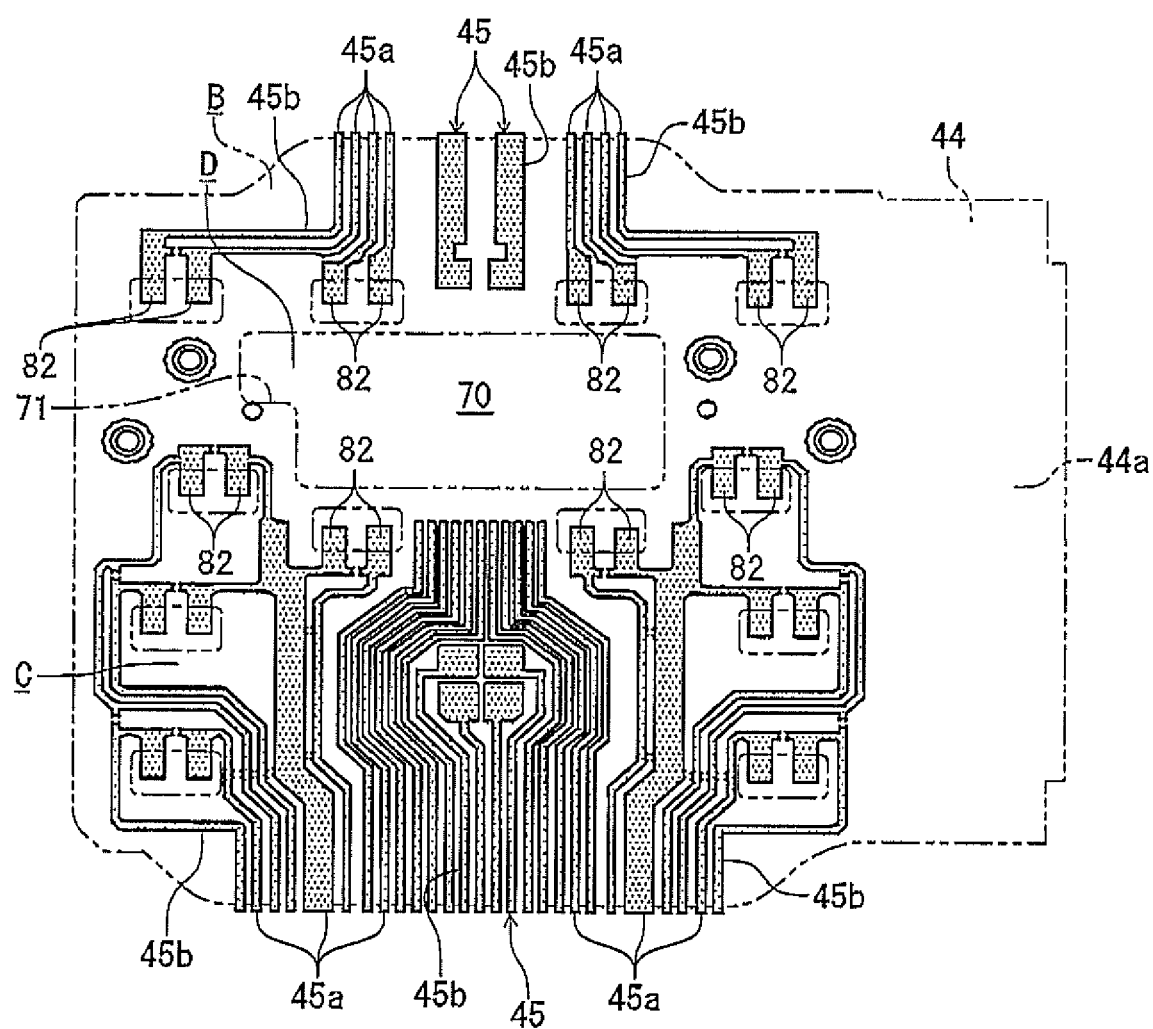
FIG. 7 is a view illustrating an electrically conductive member embedded in the partitioning portion according to the embodiment of the invention.

As illustrated in FIG. 7, a first region B on which the electrically conductive members 45b led to one of the terminal-integrated portion 45 are arranged, a second region C on which the electrically conductive members 45b led to the other terminal-integrated portion 45 are arranged, and a third region D interposed between the first region B and the second region C, are provided on the partitioning portion 44. The concave portion 71 is formed on the third region D. That is, the electrically conductive members 45b are arranged on the partitioning portion 44, which is closer to the side of an associated edge portion (i.e., the side of each of upper and lower two sides thereof, as viewed in FIG. 7) thereof than the concave portion 71. In FIG. 7, for simply showing the electrically conductive members 45b, the electrically conductive members 45b are hatched. The sensor accommodation portion 70 can be provided in the vicinity of the center of the partitioning portion 44 by arranging each of the electrically conductive members 45b not to stride across the concave portion 71.

As illustrated in FIG. 2, a cover 50 is a synthetic resin lid member for airtightly sealing an opening portion opposite to the base body 100 of the housing 40 (see FIG. 1). The cover 50 is securely fixed to a front-side end surface 42b of the housing 40 by vibration-welding. The cover 50 can be securely fixed to the front-side end surface 42b of the housing 40 by means such as bonding.

Figure 8:
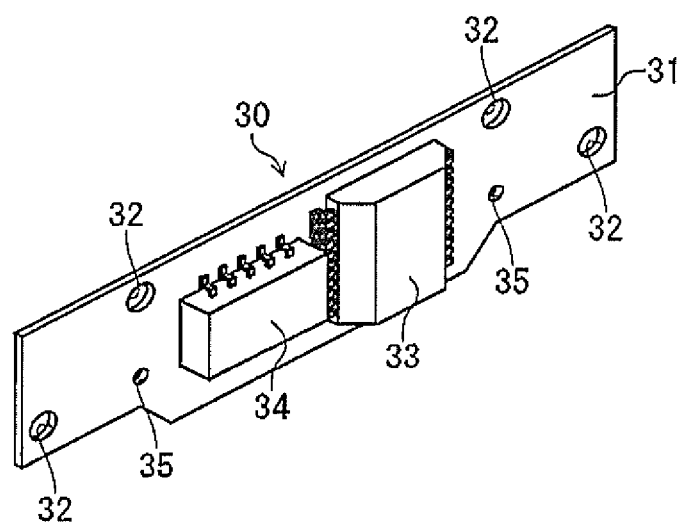
FIG. 8 is a perspective view illustrating the sensor board according to the embodiment of the invention.

As illustrated in FIG. 8, the sensor board 30 includes a rectangular board body 31 on which an electronic circuit (electrically conductive member) is printed, and the electronic components such as the angular velocity sensor 33 and the acceleration sensor 34 put on the board body 31. The behavior (i.e., a predetermined physical quantity) of the vehicle body is detected by the angular velocity sensor 33 and the acceleration sensor 34.

Figure 9:
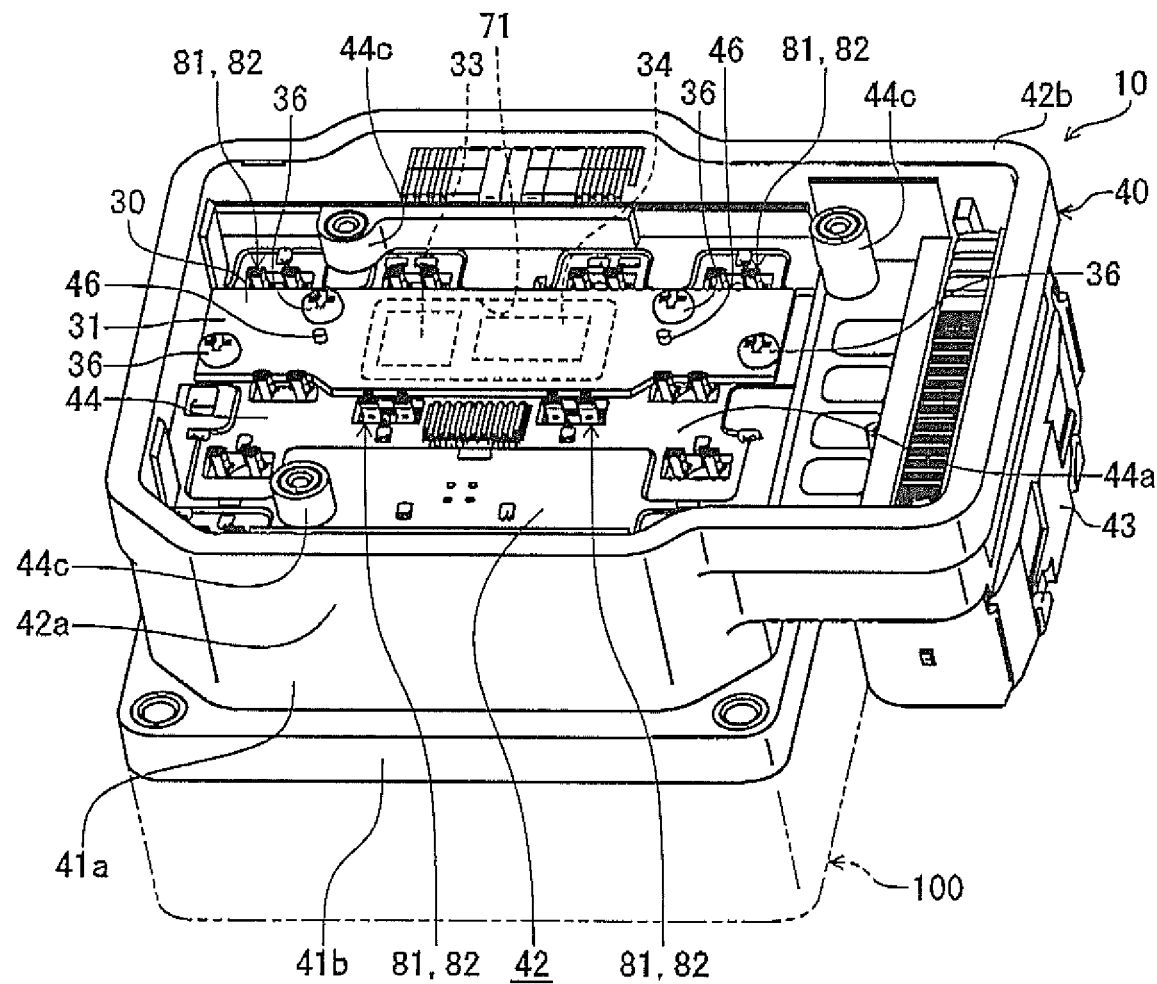
FIG. 9 is a front perspective view illustrating the housing according to the embodiment of the invention, which is in a state in which the sensor board is mounted therein.

As illustrated in FIG. 9, the sensor board 30 is arranged such that a surface on which the angular velocity sensor 33 and the acceleration sensor 34 are put is directed to the partitioning portion 44. The board body 31 is put on the front-side surface 44a of the partitioning portion 44. When the sensor board 30 is mounted on the partitioning portion 44, the angular velocity sensor 33 and the acceleration sensor 34 are accommodated in the sensor accommodation portion 70 from the side of the second accommodation chamber 42, as illustrated in FIG. 2.

As illustrated in FIG. 8, two holes 32 of each pair communicating with mounting screw holes 44e (see FIG. 3) formed in the partitioning portion 44 are formed at both end portions in the longitudinal direction of the sensor board 30, respectively. As illustrated in FIG. 9, the sensor board 30 is mounted on the front-surface 44a of the partitioning 44 by screwing into the mounting screw holes 44e (see FIG. 3) fixing-bolts 36 which are inserted into the insertion holes 32 from the front side of the sensor board 30.

Preferably, in order to enhance the stability of the sensor board 30, the board body 31 is put on the entire circumference of the edge portion of the concave portion 71 formed on the partitioning portion 44.

As illustrated in FIG. 6, a plurality of the welded parts between the first connection terminals 81 and the second connection terminals 82 are arranged around the board body 31 positioned on the front-side surface 44a of the partitioning portion 44 (see FIG. 9).

The welded parts between the connection terminals 81 and 82 are close to the outer circumferential edge portion of the board body 31. In the present embodiment, the distance between the outer circumferential edge portion of the base body 31 and each welded part between the connection terminals 81 and 82 is set to be smaller than the width x of each tip end portion of a welding tool 90 for resistance-welding the connection terminals 81 and 82.

The welding tool 90 is configured to pinch each of the connection terminals 81 and 82 with two electrode portions thereof. The width x of each tip end portion of the welding tool 90 is a breadth of one of the electrode portions. That is, the distance between the outer circumferential edge portion of the board body 31 and each welded part between the connection terminals 81 and 82 is set at a value of the distance, at which the one of the electrode portions cannot be inserted into therebetween.

In accordance with an assembling method for the electronic control unit 10 according to the present embodiment, the sensor board 30 is mounted on the front-side surface 44a of the partitioning portion 44 after the first connection terminals 81 of the electric component are welded to the second connection terminals 82 provided on the partitioning portion 44 of the housing 40.

Figure 10A:
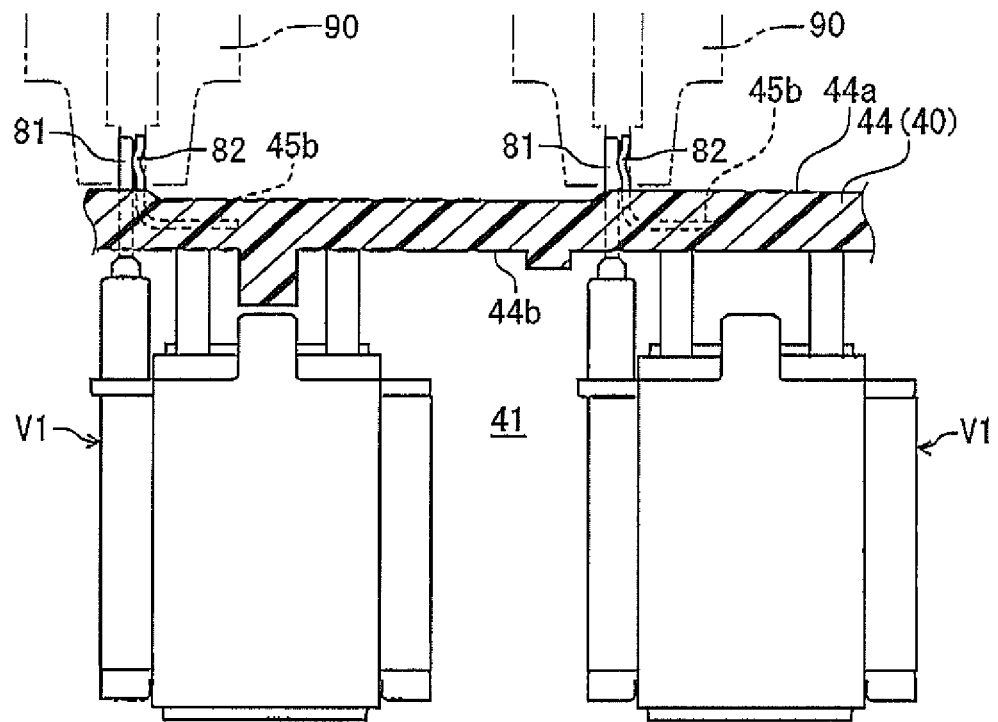
FIGS. 10A and 10B are views illustrating an assembling method for the electronic control unit according to the embodiment of the invention.

Practically, first, as illustrated in FIG. 10A, each first connection terminal 81 of the electric component such as the electromagnetic coil V1 and the associated second connection terminal 82 protrudingly provided on the partitioning portion 41 are pinched between the electrode portions of the welding tool 90 at the side of the second accommodation chamber 42. The connection terminals 81 and 82 are resistance-welded to each other by energizing the connection terminals 81 and 82 from the welding tool 90.

Figure 10B:
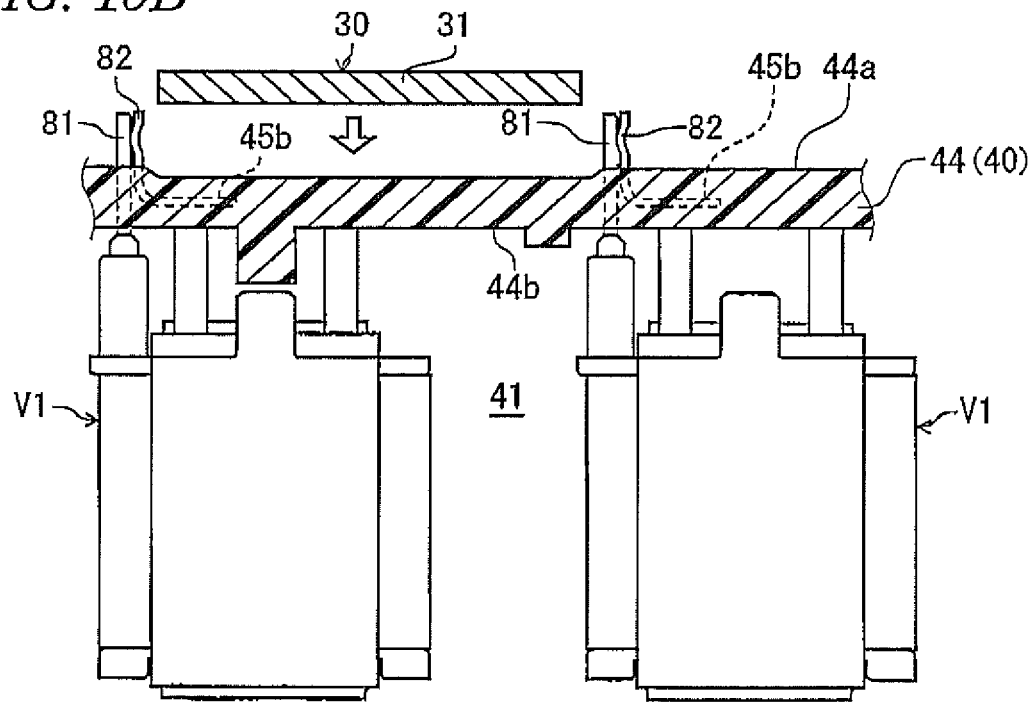

Thereafter, as illustrated in FIG. 10B, the board body 31 of the sensor board 30 is mounted on the front-side surface 44a of the partitioning 44. At that time, as illustrated in FIG. 9, the sensor board 30 can be positioned on the front-side surface 44a of the portioning portion 44 such that a detection axis of the angular velocity sensor 33 is made in agreement with the up-down direction of a vehicle and a detection axis of the acceleration sensor 34 is made in agreement with a front-back direction and a lateral direction of the vehicle by inserting each of the reference pins 46, 46 protrudingly provided on the partitioning portion 44 into an associated one of positioning holes 35, 35 (see FIG. 8) of the base body 31.

Figure 11:
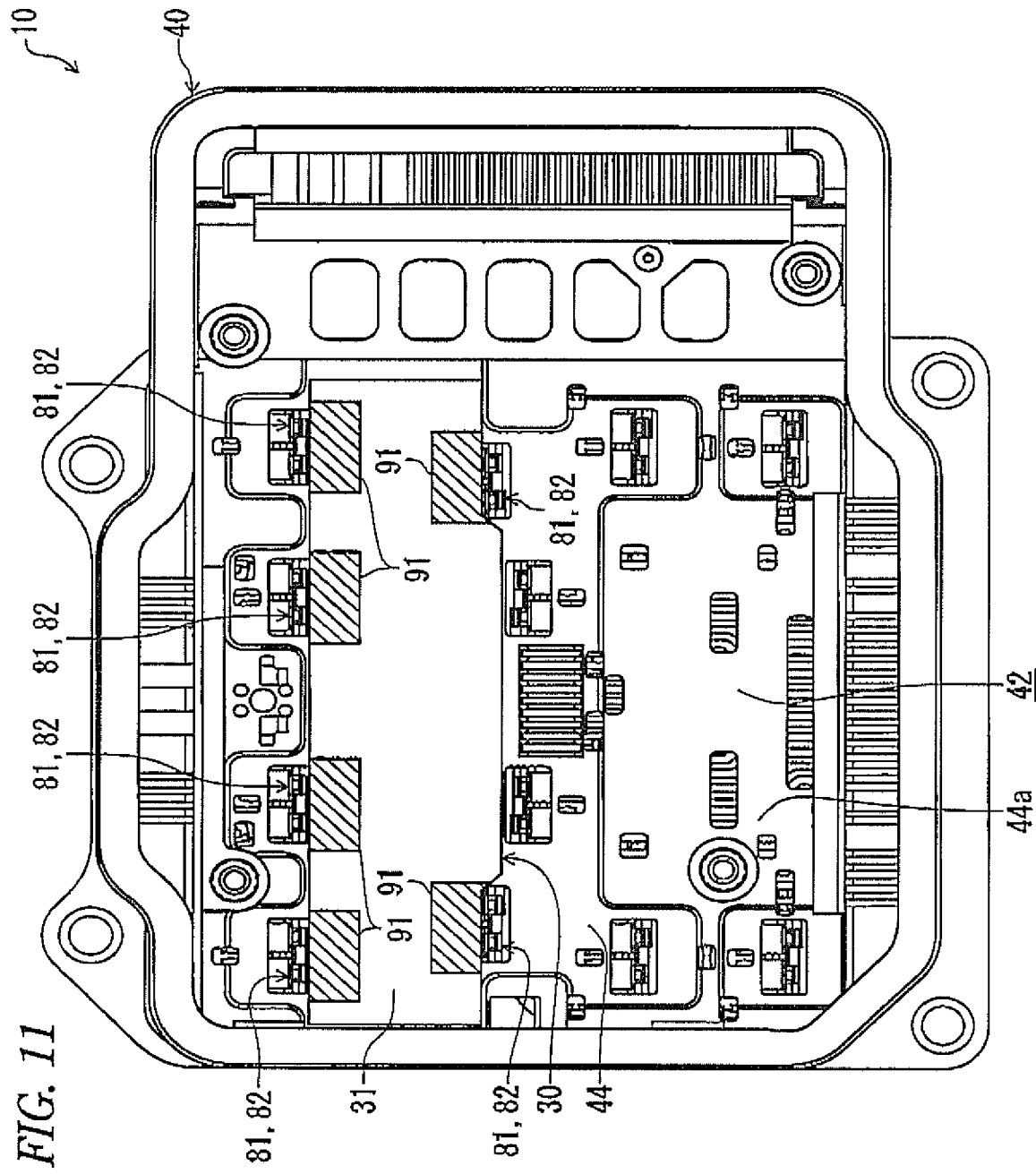
FIG. 11 is a view illustrating a movable region of a welding tool in the electronic control unit according to the embodiment of the invention.

Regions 91 hatched in FIG. 11 designate areas in each of which a part of the sensor board 30 mounted on the portioning portion 44 overlaps with a movable region in which the tip end portion of the welding tool 90 (see FIG. 10A) moves when the connection terminals 81 and 82 are resistance-welded to each other. Thus, a part of the sensor board 30 (or the board body 31) mounted on the partitioning portion 44 is arranged in each movable region.

Figure 12:
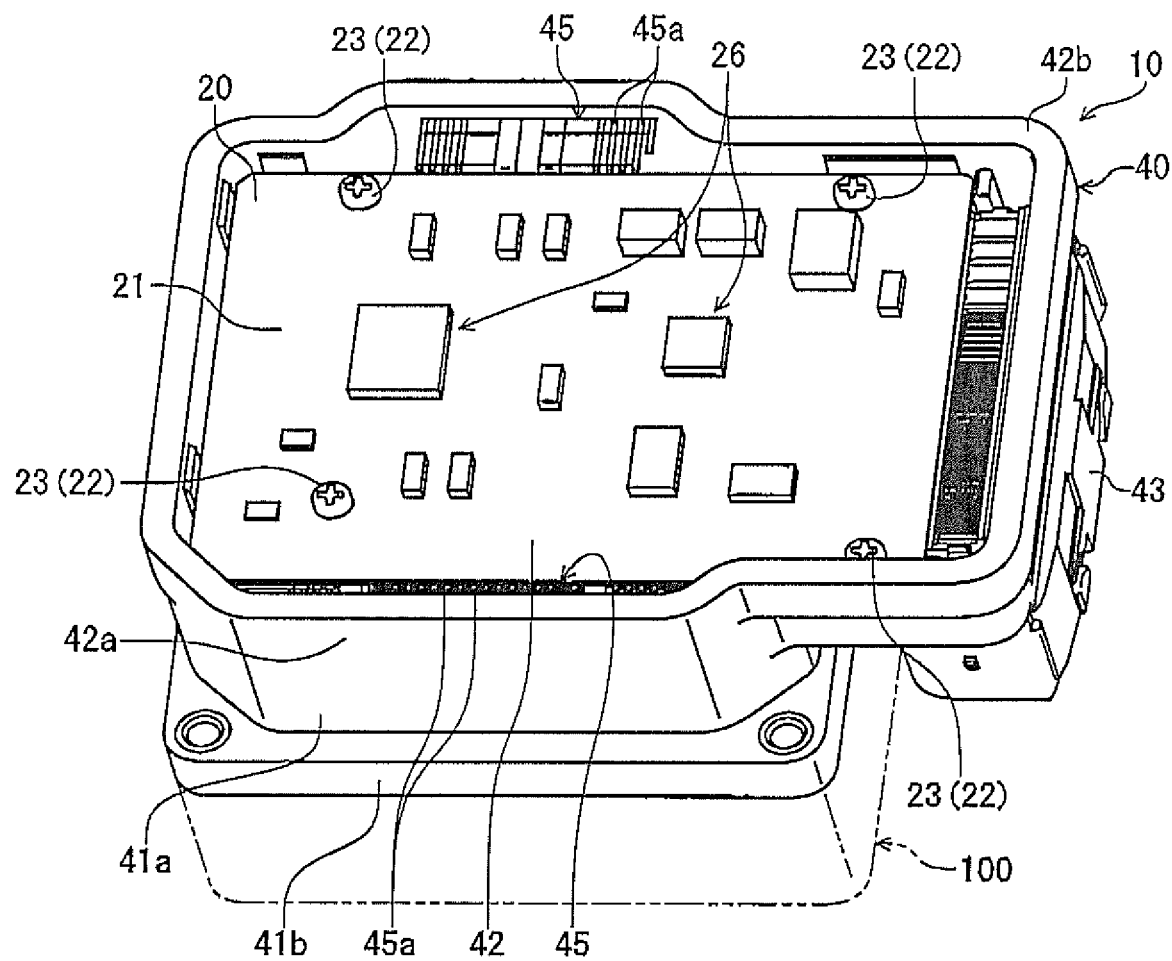
FIG. 12 is a front perspective view illustrating the housing according to the embodiment of the invention, which is in a state in which the control board is mounted therein.

As illustrated in FIG. 12, the control board 20 is obtained by mounting electronic components 26 such as semiconductor chips on the rectangular board body 21 on which an electronic circuit (electrically conductive member) is printed. The control board 20 is accommodated in the second accommodation chamber 42 such that a surface on which the electronic components 26 are mounted is set as a front-side surface.

The control board 20 is configured to control the opening/closing of the electromagnetic valve V and an operation of the motor 200 based on information obtained from the sensor board 30 and various sensors such as the pressure sensor S illustrated in FIG. 2 and on a preliminarily stored program or the like.

As illustrated in FIG. 12, the control board 20 is configured such that insertion holes 22 are formed in the vicinities of the four corners of the board body 21. The board body 21 is put on the protruding end surface of each board holding portion 44c of the partitioning portion 44 (see FIG. 3), and that the insertion hole 22 communicates with the screw hole of each board holding portion 44c (see FIG. 3). Each fixing bolt 23 inserted from the front side of the control board 20 into the insertion holes 22 is screwed into the screw hole of the associated board holding portion 44c (see FIG. 3) to thereby mount the control board 20 on the side of the second accommodation chamber 42 of the partitioning portion 44.

Consequently, as illustrated in FIG. 2, the sensor board 30 and the control board 20 are accommodated in a hierarchical state in the second accommodation chamber 42 so as to be supported by the partitioning portion 44. The board body 21 of the control board 20 is larger than the board body 31 of the sensor board 30. Thus, the control board 20 is mounted on the partitioning portion 49 so as to cover over the sensor board 30.

The control board 20 mounted on the side of the second accommodation chamber 42 of the partitioning portion 44 (see FIG. 3) is such that the electronic circuit of the control board 20 and the terminal 45a of the terminal-integrated portion 45 are electrically connected to each other by a bonding-wire 45c. Consequently, various electronic components mounted on the control board 20 are electrically connected to the electric components mounted on the board 100.

The electrically conductive member (not shown) embedded in the partitioning portion 44 is electrically connected to the sensor board 30 mounted on the partitioning portion 44 illustrated in FIG. 2. The electronic circuit of the sensor board 30 is electrically connected to that of the control board 20 by electrically connecting the electrically conductive member to the terminal 45a of the terminal-integrated portion 45. Consequently, behavior information concerning the behavior of the vehicle detected by the angular velocity sensor 33 and the acceleration sensor 34 mounted on the sensor board 30 can be output to the control board 20.

The electronic control unit 10 according to the present embodiment described above has the following advantages.

The electronic control unit 10 according to the present embodiment is such that the ribs 44g and 44h are provided on the rear surface 44b of the partitioning portion 44 and the outer surface 71b of the concave portion 71, as illustrated in FIG. 4. Thus, the stiffness of the partitioning portion and the concave portion 71 increases. The natural frequencies of the partitioning portion 44 and the concave portion 71 become higher. Consequently, low-frequency vibrations become difficult to be transmitted to the angular velocity sensor 33 and the acceleration sensor 34 supported by the partitioning portion 44 and accommodated in the sensor accommodation portion 70. Accordingly, the detection accuracy of the angular velocity sensor 33 and the acceleration sensor 34 can be enhanced.

Even when the cover 50 is vibration-welded to the end surface 42b of the housing 90 illustrated in FIG. 2 while the angular velocity sensor 33 and the acceleration sensor 34 are accommodated in the sensor accommodation portion 70, low-frequency vibrations become difficult to be transmitted to the angular velocity sensor 33 and the acceleration sensor 34 accommodated in the sensor accommodation portion 70. Thus, the detection accuracy of the angular velocity sensor 33 and the acceleration sensor 34 can be enhanced.

The electronic control unit 10 according to the present embodiment is configured so that a plurality of second ribs 44b are protrudingly provided on the outer surface 71b of the concave portion 71 formed on the partitioning portion 44, as illustrated in FIG. 4. Thus, the thickness of the concave portion 71 increases. Accordingly, when the ejection-molding of the partitioning portion 44 is performed, the run of molten metal into the concave portion 71 is enhanced in the cavity of a mold. The accuracy of molding the sensor accommodation portion 70 can be enhanced.

In addition, in the electronic control unit 10 of the present embodiment, as illustrated in FIG. 5, the first rib 44g provided on the rear surface 44b of the partitioning portion 44 partitions the rear surface 44b of the partitioning portion 44 into a plurality of regions A to surround the mounting location of each electric component. The arrangement and the height of the first rib 44g are set to prevent the first rib 44g from interfering with the electric components.

In the electronic control unit 10 according to the present embodiment, the sensor accommodation portion 70 is formed utilizing the concave portion 71 formed in the partitioning portion 44. The sensor accommodation portion 70 is provided effectively utilizing the space of the first accommodation chamber 41. Consequently, the housing 40 can be miniaturized.

In the electronic control unit 10 according to the present embodiment, heat generated from the electric component is shielded by the concave portion 71. Consequently, heat can be prevented from affecting the angular velocity sensor 33 and the acceleration sensor 34. Accordingly, the detection accuracy of each of the sensors 33 and 34 can be enhanced.

In accordance with the vehicle brake hydraulic pressure control apparatus U using the electronic control unit 10 according to the present embodiment, as illustrated in FIG. 1, the detection accuracy of each of the angular velocity sensor 33 and the acceleration sensor 34 (see FIG. 2) for detecting the behavior of the vehicle body can be enhanced. The accuracy of brake control can be improved.

In the electronic control unit 10 according to the present embodiment, as illustrated in FIG. 6, the distance between the board body 31 of the sensor board 30 mounted on the front-side surface 44a of the partitioning portion 44 and the welded part of each of the connection terminals 81 and 82 is set to be smaller than the width x of the tip end portion of the welding tool 90 for resistance-welding the connection terminals 81 and 82. Accordingly, the distance between the sensor board 30 and each of the connection terminals 81 and 82 arranged around the sensor board 30 can be reduced. Consequently, the housing 40 can be miniaturized.

In accordance with an assembling method for the electronic control unit 10 according to the present embodiment, as illustrated in FIGS. 10A and 10B, the board body 31 of the sensor board 30 is mounted on the front-side surface 44a of the partitioning portion 44 after the connection terminals 81 and 82 are resistance-welded to each other.

In the electronic control unit 10 according to the present embodiment, as illustrated in FIG. 11, a part of the sensor board 30 mounted on the partitioning portion 44 is arranged in the movable region of the welding tool 90 (see FIG. 10A). Thus, the space in the housing 40 can effectively be utilized. Consequently, the sensor board 30 can be enlarged.

In the foregoing description, the embodiment of the invention has been described. However, the invention is not limited thereto and can appropriately be modified without departing from the scope and the spirit of the invention.

For example, according to the above embodiment, as illustrated in FIG. 4, the first rib 44g is provided on the rear-side surface 44b of the partitioning portion 44. However, the first rib 44g can be provided on the front-side surface 44a of the partitioning portion 44. In addition, the first rib 44g can be provided on both of the front-side surface 44a and the rear-side surface 44b. Similarly, according to the above embodiment, the second rib 44h is provided on the outer surface 71b of the concave portion 71. However, the second rib 44h can be provided on the inner surface or both surfaces of the concave portion 71.

Figure 13:
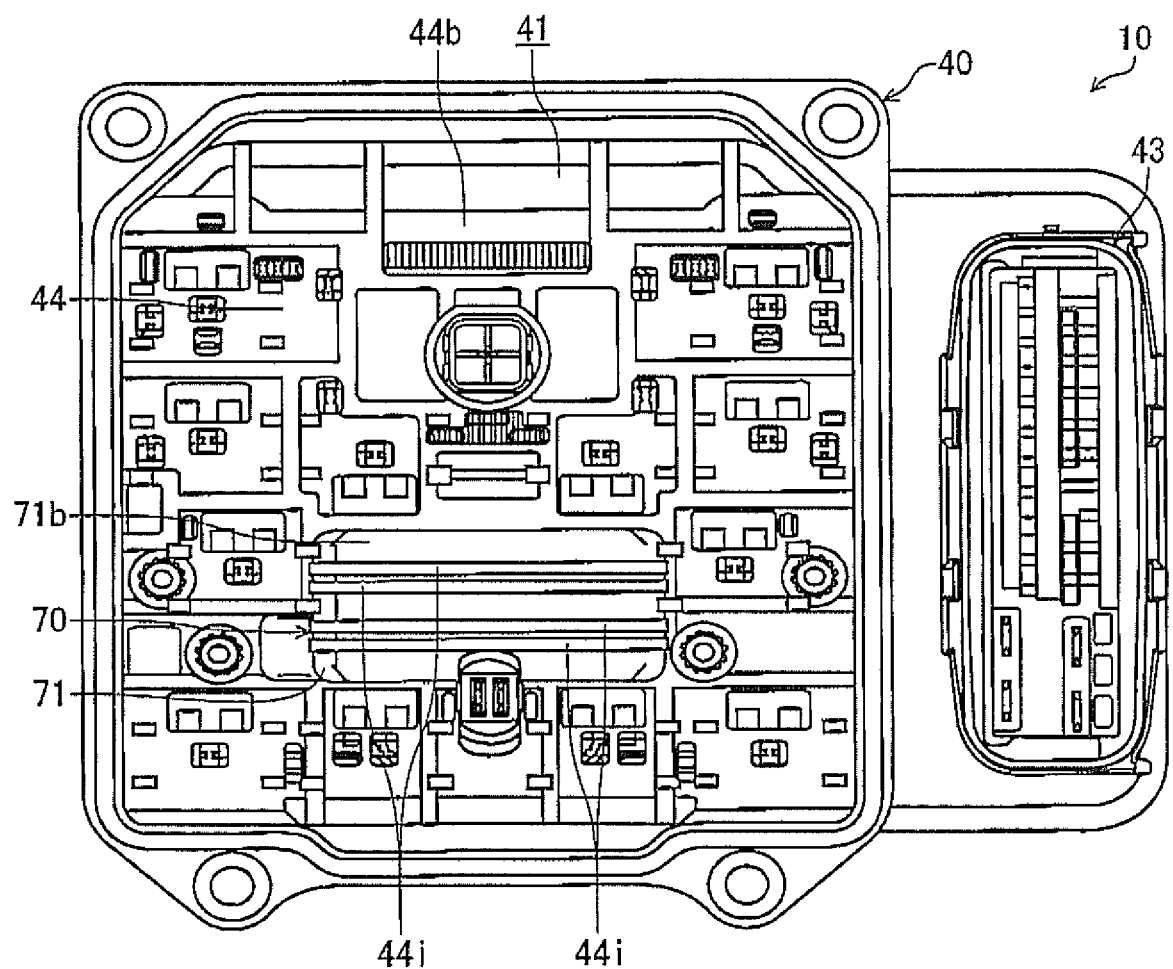
FIG. 13 is a view illustrating an electronic control unit according to another embodiment of the invention by showing a housing thereof from rear.

As illustrated in FIG. 13, a plurality of second ribs 44i provided on the outer surface 71b of the concave portion 71 on the partitioning portion 44 can be extended to pass through one of the terminal-integrated portions 45 (see FIG. 2) and the other terminal-integrated portion 45 (see FIG. 2). That is, the terminal-integrated portions 45, 45 (see FIG. 3) are arranged on two sides (i.e., the upper and lower two sides, as viewed in FIG. 13), respectively, on both sides in the direction of an extension of each second rib 44i. Each second rib 44i can be arranged to extend in a direction perpendicular to one side (i.e., one side disposed on the left-hand side, as viewed in FIG. 13) of the partitioning portion 44, on which the terminal-integrated portions 45, 45 (see FIG. 3) and the connector connection portion 43 are not arranged.

With this configuration, when the ejection-molding of the partitioning portion is performed, a sprue is provided in one side on which the terminal-integrated portions 45, 45 and the connector connection portion 43 do not exist, as illustrated at a left-hand side part of FIG. 13. Thus, the cavity of each second rib 44i is arranged to extend linearly from the sprue to another side illustrated at a right-hand side part of FIG. 13. Accordingly, when the ejection-molding of the partitioning portion 44 is performed, the run of molten metal into each second rib 44i is enhanced in the cavity of a mold. The accuracy of molding the sensor accommodation portion 70 can be enhanced.

As illustrated in FIG. 2, in the above embodiment, the sensor accommodation portion 70 is formed utilizing the concave portion 71 provided on the partitioning portion 44. However, the sensor accommodation portion can be formed utilizing an opening portion provided in the partitioning portion 44.

What is claimed is:

1. An electronic control unit comprising:
a sensor board on which at least one sensor is mounted;
a control board configured to control an operation of each electric component, based on a physical quantity detected by the at least one sensor; and
a housing configured to accommodate the sensor board and the control board, wherein:
in an internal space of the housing, a first accommodation chamber in which the electric components are accommodated, a second accommodation chamber having a stepped portion and in which the sensor board and the control board are accommodated in a hierarchical state, and a partitioning portion which partitions between the first accommodation chamber and the second accommodation chamber are formed;
the sensor board and the control board are supported by the partitioning portion, and a rib is protrudingly provided on the partitioning portion;
a concave portion opened in a bottom surface of the second accommodation chamber formed in the partitioning portion and extending into the first accommodation chamber; and
a plurality of ribs protrudingly provided on at least one of an inner surface and an outer surface of the concave portion.

2. The electronic control unit according to claim 1, wherein:
a surface of the partitioning portion, which is provided at a side of the first accommodation chamber, is partitioned into a plurality of regions by the rib protrudingly provided on the partitioning portion; and
a plurality of the electric components are supported by the partitioning portion in the plurality of regions, respectively.

3. The electronic control unit according to claim 1, wherein:
a sensor accommodation portion serving as a space accommodating the at least one sensor is formed utilizing the concave portion.

4. The electronic control unit according to claim 1, wherein:
the at least one sensor includes an angular velocity sensor and an acceleration sensor.

5. The electronic control unit according to claim 4, wherein:
a cover airtightly sealing an opening portion of the housing is vibration-welded to the opening portion of the housing.

6. A vehicle brake hydraulic pressure control apparatus comprising:
a base body in which a brake fluid line is formed; and
an electronic control unit according to claim 4, wherein
the control board varies a brake fluid pressure in the brake fluid line by controlling an operation of the electric components based on behavior of a vehicle body, which is detected by the at least one sensor.

7. An electronic control unit comprising:
a sensor board on which at least one sensor is mounted;
a control board configured to control an operation of an electric component, based on a physical quantity detected by each of the at least one sensor; and
a housing configured to accommodate the sensor board and the control board, wherein:
a first accommodation chamber in which the electric component is accommodated, a second accommodation chamber having a stepped portion and in which the sensor board and the control board are accommodated in a hierarchical state, and a partitioning portion which partitions between the first accommodation chamber and the second accommodation chamber are formed in an internal space of the housing;
the sensor board and the control board are supported by the partitioning portion;

a concave portion opened in a bottom surface of the second accommodation chamber is formed in the partitioning portion and extending into the first accommodation chamber;

a sensor accommodation portion serving as a space accommodating the at least one sensor is formed utilizing the concave portion; and a plurality of ribs are protrudingly provided on at least one of an inner surface and an outer surface of the concave portion.

8. The electronic control unit according to claim 7, wherein:

the ribs are linearly provided in parallel with one another in the concave portion.

9. The electronic control unit according to claim 8, wherein:

terminal-integrated portions to be electrically connected to the ribs are arranged at positions facing each other across the concave portion in the concave portion; and the ribs are extended in a direction passing through between one of the terminal-integrated portion and the other terminal-integrated portion.

10. The electronic control unit according to claim 8, wherein:

terminal-integrated portions to be electrically connected to the ribs are arranged at positions facing each other across the concave portion; and the ribs are extended in a direction directed from one of the terminal-integrated portion to the other terminal-integrated portion.

11. The electronic control unit according to claim 7, wherein:

the at least one sensor includes an angular velocity sensor and an acceleration sensor.

12. The electronic control unit according to claim 11, wherein:

a cover airtightly sealing an opening portion of the housing is vibration-welded to the opening portion.

13. A vehicle brake hydraulic pressure control apparatus comprising a base body in which a brake fluid line is formed; and an electronic control unit according to claim 11, wherein the control board varies a brake hydraulic pressure in the brake fluid line by controlling an operation of the electric component based on behavior of a vehicle body, which is detected by the at least one sensor.

14. The electronic control unit according to claim 1, further comprising a plurality of support pieces extending from a rear surface of the partitioning portion into the first accommodation chamber and configured to prevent the electric components from vibrating.

15. The electronic control unit according to claim 1, wherein the rib extends linearly along a direction from one terminal-integrated portion to another terminal-integrated portion.

16. An electronic control unit comprising:

a sensor board on which at least one sensor is mounted;

a control board configured to control an operation of each electric component, based on a physical quantity detected by the at least one sensor; and a housing configured to accommodate the sensor board and the control board, wherein:

in an internal space of the housing, a first accommodation chamber in which the electric components are accommodated, a second accommodation chamber having a stepped portion and in which the sensor board and the control board are accommodated in a hierarchical state, and a partitioning portion which partitions between the first accommodation chamber and the second accommodation chamber are formed;

the sensor board and the control board are supported by the partitioning portion, and a rib is protrudingly provided on the partitioning portion;

a concave portion opened in a bottom surface of the second accommodation chamber formed in the partitioning portion and extending into the first accommodation chamber; and a rib protrudingly provided on at least one of an inner surface and an outer surface of the concave portion and at least at a bottom portion of the concave portion.

17. An electronic control unit comprising:

a sensor board on which at least one sensor is mounted;

a control board configured to control an operation of each electric component, based on a physical quantity detected by the at least one sensor; and a housing configured to accommodate the sensor board and the control board, wherein:

in an internal space of the housing, a first accommodation chamber in which the electric components are accommodated, a second accommodation chamber having a stepped portion and in which the sensor board and the control board are accommodated in a hierarchical state, and a partitioning portion which partitions between the first accommodation chamber and the second accommodation chamber are formed;

the sensor board and the control board are supported by the partitioning portion, and a rib is protrudingly provided on the partitioning portion;

a concave portion opened in a bottom surface of the second accommodation chamber formed in the partitioning portion and extending into the first accommodation chamber; and a rib protrudingly provided on at least one of an inner surface and an outer surface of the concave portion, which extends into the first accommodation chamber.

* * * * *